United States Patent [19]

McClure

[11] Patent Number: 5,627,787

[45] Date of Patent: May 6, 1997

[54] PERIPHERY STRESS TEST FOR SYNCHRONOUS RAMS

[75] Inventor: David C. McClure, Carrollton, Tex.

[73] Assignee: SGS-Thomson Microelectronics, Inc., Carrollton, Tex.

[21] Appl. No.: 367,979

[22] Filed: Jan. 3, 1995

[51] Int. Cl.$^6$ ............................. G11C 7/00; G11C 29/00
[52] U.S. Cl. ............... 365/201; 365/230.06; 365/189.09
[58] Field of Search ................................. 365/200, 201, 365/230.01, 230.06, 189.09; 371/10.1, 10.2, 21.1

[56] References Cited

U.S. PATENT DOCUMENTS

| | | | |
|---|---|---|---|
| 5,287,312 | 2/1994 | Okamura et al. | 365/201 |
| 5,341,336 | 8/1994 | McClure | 365/201 |
| 5,357,193 | 10/1994 | Tanaka et al. | 371/21.1 |
| 5,379,260 | 1/1995 | McClure | 365/201 |
| 5,424,988 | 6/1995 | McClure | 365/201 |
| 5,455,799 | 10/1995 | McClure et al. | 365/201 |

*Primary Examiner*—Viet Q. Nguyen
*Attorney, Agent, or Firm*—Theodore E. Galanthay; Lisa K. Jorgenson; Renee M. Larson

[57] ABSTRACT

According to the method of the present invention, stress testing of decoders and other periphery circuits of synchronous RAMs is performed within a reasonable period of time and without an increase in the complexity of stress testing or fabrication of synchronous RAMs. In order to stress test decoders and periphery circuits of a synchronous RAM to obtain maximum fault coverage of possible latent defects, a periphery stress mode is defined through appropriate manipulation of the Power-On Reset signal of the device such that all nodes of a memory array of the synchronous RAM are pulled in the opposite logic state from that required for a memory cell stress mode. In the periphery stress mode, the Power-On Reset signal is allowed to pulse upon power-up of the synchronous RAM device such that latches and flip flops of the device are forced in a logic state that disables all rows and columns of the memory array of the device. Additionally, all D.C. (direct current) paths of the synchronous RAM are disabled so that a high power supply voltage may be applied during the periphery stress mode without fear of transistor "snap back voltage". Thus, once all D.C. paths of the synchronous RAM are disabled, a Vcc voltage level as high as ten volts may be applied during the periphery stress mode without experiencing transistor impact ionization due to high substrate current, known as BVDII or "snap back voltage".

38 Claims, 3 Drawing Sheets

PERIPHERY STRESS TEST FOR SYNCHRONOUS RAMS

CROSS REFERENCE TO RELATED APPLICATIONS

The subject matter of the present application is related to copending United States application, Ser. No. 08/172,854, titled "Stress Test Mode", Docket No.: 93-C56, filed Dec. 22, 1993; copending United States application, Ser. No. 08/267,666, titled "Circuit Which Provides Power On Reset Disable During A Test Mode", Docket No.: 94-C-30, filed Jun. 29, 1994; United States application, titled "Output Driver with Limited Output High Voltage", Docket No.: 94-C-116; and United States application, titled "Circuit for Providing a Compensated Bias Voltage", Docket No.: 94-C-114, all of which are assigned to the assignee hereof and are heroin incorporated by reference.

BACKGROUND OF THE INVENTION

The present invention relates in general to integrated circuits, and more particularly to memory arrays of integrated circuits. Still more particularly, the present invention relates to the stress testing of periphery circuits of synchronous RAMs (Random Access Memories). Memory arrays of synchronous RAM devices are composed of many different circuits which are all necessary to its successful operation. These circuits within a synchronous RAM may include, for example, row decoders, column decoders, write decoders, and various pre-decoding and post-decoding circuits. Stress test modes may be employed to stress the integrity of synchronous RAM memory arrays. A synchronous RAM device may be put into a memory cell stress mode, for instance, in which all the rows and columns of all the memory cells of the device are selected and accessed in order to allow for stressing of the memory cells.

While stress testing of memory cells of synchronous RAMs has thus been accomplished, stress testing of synchronous RAM decoders and other periphery circuits is typically not performed due to the inordinate amount of time such stress testing would require. In order to stress test each gate in the decoders and other periphery circuits, each and every possible address combination must be individually selected and a stress voltage then applied to the device. For example, stress testing of decoders and other periphery circuits of a 1 Meg synchronous RAM, such as a BRAM (Burst RAM), organized as a 128K by 8k memory array would require selecting and then applying a stress voltage for 128,000 address combinations. As is known in the art, a BRAM may be used with a microprocessor and has an internal address counter which will increment addresses when in a burst mode such that the microprocessor does not need to provide an address count to the BRAM. Because selecting and then stressing every possible address combination would be extremely time consuming, stress testing of decoder and other periphery circuits of synchronous RAMs is typically not performed.

An unfortunate effect of not performing stress testing on decoder and other periphery circuits of synchronous RAMs is that latent defects contained within decoder and periphery circuitry are not detected. Thus a manufacturer of synchronous RAMs may unwittingly produce marginal devices having latent defects. Therefore, there exists an unmet need in the art to be able to stress test decoders and other periphery circuits of synchronous RAMs within a reasonable period of time.

SUMMARY OF THE INVENTION

It would be advantageous in the art be able to stress test decoders and other periphery circuits of synchronous RAMs within a reasonable period of time.

It would further be advantageous in the art to be able to perform such stress testing of decoders and other periphery circuits of synchronous RAMs without an increase in the complexity of stress testing or fabrication of synchronous RAMs.

Therefore, according to the present invention, a method for performing stress testing of decoders and other periphery circuits of synchronous RAMs within a reasonable period of time and without an increase in the complexity of stress testing or fabrication of synchronous RAMs is disclosed. In order to stress test decoders and periphery circuits of a synchronous RAM to obtain maximum fault coverage of possible latent defects, a periphery stress mode is defined through appropriate manipulation of a control signal, such as the Power-On Reset signal, of the device such that all nodes of a memory array of the synchronous RAM are pulled in the opposite logic state from that required for a memory cell stress mode. Additionally, all D.C. (direct current) paths of the synchronous RAM are disabled so that a high power supply voltage may be applied during the periphery stress mode without fear of transistor "snap back voltage".

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DESCRIPTION OF THE INVENTION

The present invention provides for the stress testing of decoders and other periphery circuits, such as row decoders, column decoders, write decoders, and various pre-decoding and post-decoding circuits, of a synchronous RAM device. In order to get maximum fault coverage of possible latent defects within the decoder and periphery circuits, it is desirable to pull all nodes of a memory array of the synchronous RAM in the opposite logic state from that required for a memory cell stress mode. This is accomplished by defining a periphery stress mode that makes use of a control signal such as the power-on reset signal of the device to utilize most of the circuitry in the opposite logic state from the memory cell stress mode. In the memory cell stress mode, the power-on reset signal of the device is disabled locally in individual circuits of the synchronous RAM or globally. However, the present invention allows the power-on reset signal to pulse upon power-up of the synchronous RAM device such that latches and flip flops of the device are forced in a logic state that disables all rows and columns of the memory array of the device. This is opposite to the effect of a memory cell stress mode where all rows and columns are enabled.

Additionally, according to the present invention, it is necessary to disable all D.C. (direct current) paths of the device to allow a high Vcc stress voltage, such as 9 volts and typically between approximately seven to ten volts, to be applied to the device. If D.C. current paths exist that leave transistors of the synchronous RAM in saturation, then latch-up of these transistors may result at high levels of power supply Vcc because of transistor impact ionization due to high substrate current, known as BVDII or "snap back voltage".

Figure 1:
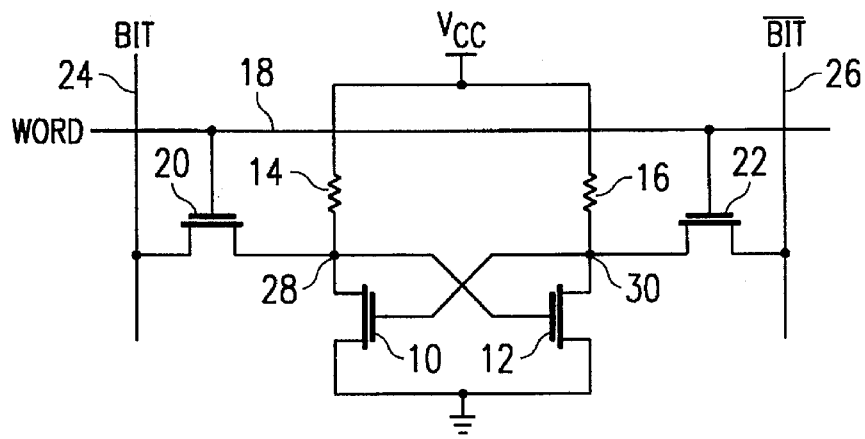
FIG. 1 is a circuit diagram illustrating a memory cell within a memory array.

Referring to FIG. 1, a circuit diagram of a memory cell within a memory array of a synchronous RAM is shown. A first transistor 10, a second transistor 12, a first load element 14 associated with first transistor 10, and a second load element 16 associated with second transistor 12 are arranged in a flip-flop configuration. Those skilled in the art will recognize that load elements 14 and 16 may be resistors as shown or they may be p-channel transistors.

Row line 18, denoted here as WORD, is connected to the gate of a third transistor 20 and the gate of a fourth transistor 22 and is used to activate the memory cell. Bit signal line 24 and Bit bar signal line 26, respectively, may then be used to write data to and read data from the memory cell. Thus, first transistor 10 and second transistor 12 act as storage elements while third transistor 20 and fourth transistor 22 act as select elements. Data is stored as voltage levels with the two sides of the flip-flop in opposite voltage configurations. The memory cell has two data states, a high voltage level or logic 1, and a low voltage level or logic 0. If the memory cell is storing a logic 1, node 28 is a high voltage level and node 30 is a low voltage level, first transistor 10 is turned off, and second transistor 12 is turned on. If, on the other hand, the memory cell is storing a logic 0, node 28 is a low voltage level and node 30 is a high voltage level, first transistor 10 is turned on, and second transistor 12 is turned off.

Figure 2:
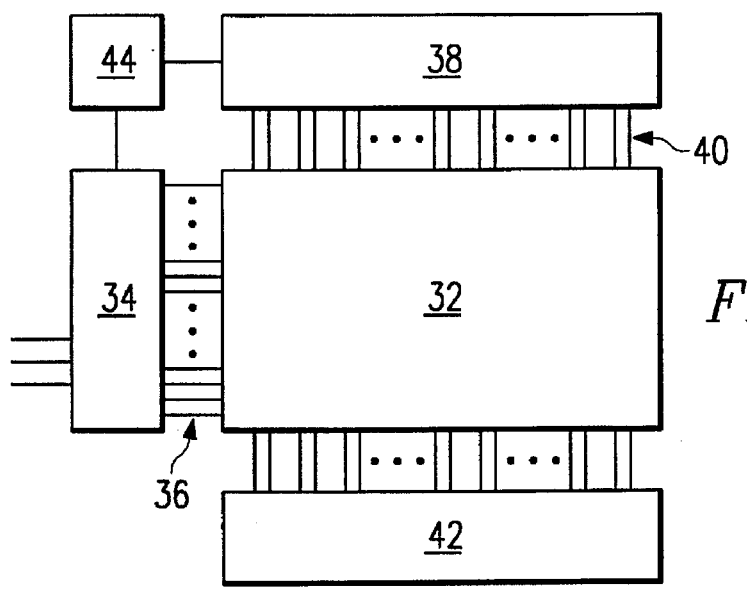
FIG. 2 is a block diagram illustrating a memory array of a synchronous RAM.

A plurality of memory cells like the one shown in FIG. 1 are imbedded in a memory array of a synchronous RAM. FIG. 2 is a block diagram of the circuitry associated with a memory array of a synchronous RAM. Memory array 32 is accessed by a row decoder 34 which selects a word line from a plurality of lines 36. A column decoder 38 selects the appropriate Bit and Bit bar signals 40. Write decoder 42 is utilized to write data into the memory array 32. One skilled in the art will recognized that column decoder 38 and write decoder 42 may be combined as one circuit if desired. Furthermore, row decoder 34 and column decoder 38 may include pre-decoding, decoding, and post-decoding circuit of the type well known in the art.

Figure 3:
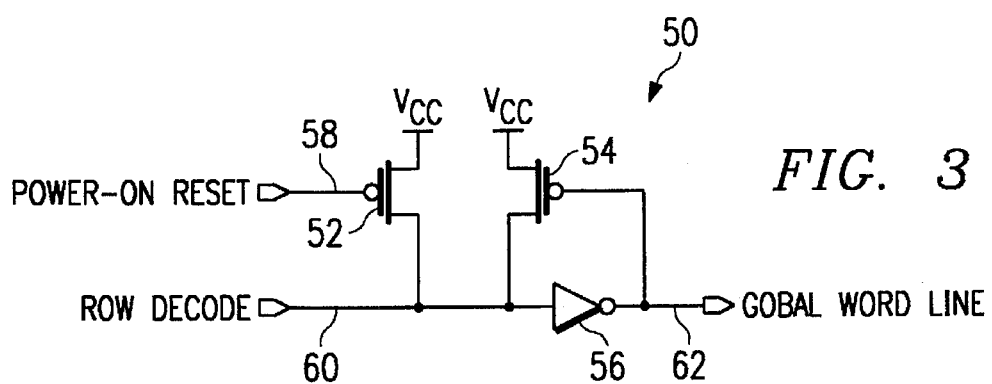
FIG. 3 is a circuit diagram of a global word line decoder circuit, according to the present invention.

A method for stress testing decoder and other periphery circuits of a synchronous RAM device will now be described in conjunction with two decoder circuits suitable for use with the method of the present invention; these two decoder circuits are simply illustrative of many such decoder or other periphery-type circuits with which the present invention may be used. Referring to FIG. 3, a global word line decoder circuit 50 is illustrated. Global word line decoder circuit 50 is comprised of a first transistor 52, a second transistor 54 and an inverter 56. A first source/drain of transistors 52 and 54 are each connected to power supply voltage Vcc as shown. Row Decode signal 60 passes through inverter 56 which generates Global Word Line signal 62. A second source/drain of transistors 52 and 54 are connected to Row Decode Signal 60. The gate of transistor 52 is supplied with Power-On Reset signal 58 while the gate of transistor 54 is supplied with Global Word Line signal 62 as shown.

According to the present invention, the periphery stress mode of a synchronous RAM device is entered through appropriate manipulation of Power-On Reset signal 58. Power-On Reset signal 58 is allowed to pulse upon power-up of the synchronous RAM device such that all rows and columns of the memory array are disabled. This is opposite of the memory cell stress mode where the Power-On Reset signal 58 would be disabled and all the nodes of the memory array of the synchronous RAM device are pulled in the opposite logic state than is required for the memory cell stress mode. The periphery stress mode allows maximum fault coverage of possible latent defects within decoder and periphery circuits such as Global Word Line Decoder circuit 50. Additionally, initializing Global Word Line Decoder circuit 50 into a deselecting state disables all the D.C. current paths of circuit 50 such that a high Vcc stress voltage, such as 9 volts, may be applied in the periphery stress mode without fear of "snap back voltage".

Figure 4:
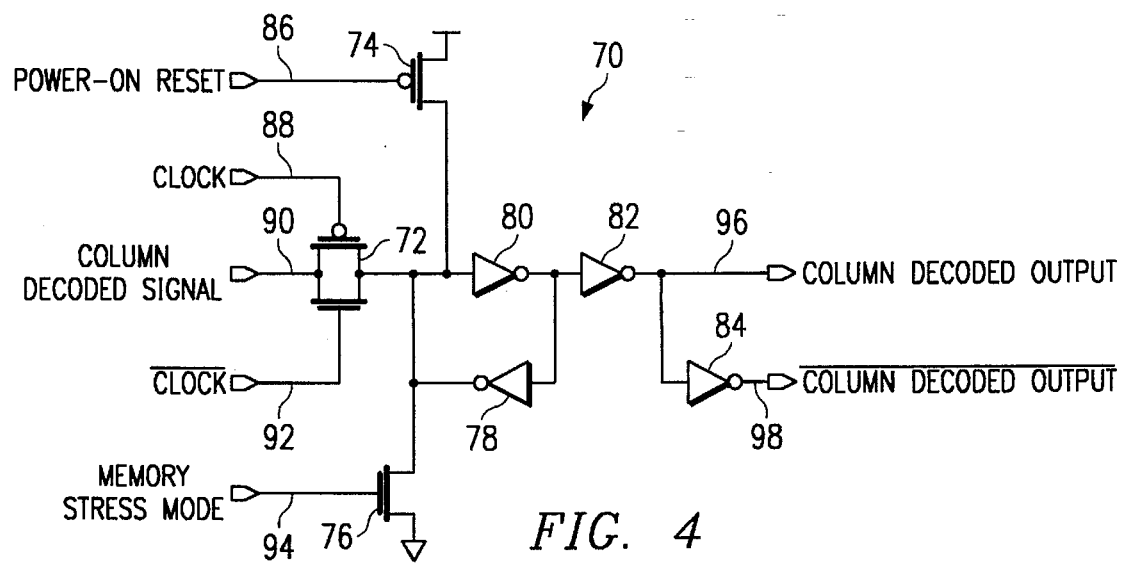
FIG. 4 is a circuit diagram of a slave latch circuit which is part of a column decoder circuit, according to the present invention.

Referring to FIG. 4, a slave latch circuit 70 which is part of a column decoder circuit is illustrated. Slave latch circuit 70 is comprised of a pass gate 72, a first transistor 74, a second transistor 76, a first inverter 78, a second inverter 80, a third inverter 82, and a fourth inverter 84. Pass gate 72 is controlled by Clock signal 88 and Clock bar signal 92 which together control when pass gate 72 may pass through Column Decoded signal 90. The output signal of pass gate 72, a source/drain of transistor 74, a source/drain of transistor 76, the input signal of inverter 80, and the output signal of inverter 78 together define Node 1 as shown. The gate of transistor 74 is controlled by Power-On Reset signal 86 while the gate of transistor 76 is supplied with Memory Stress Mode signal 94. The output signal of inverter 80 is supplied to inverter 78 and inverter 82 as shown. Inverter 82 produces Column Decoded output signal 96; inverter 84 simply inverts Column Decoded output signal 96 to produce Column Decode Bar output signal 98 as shown. Clock signal 88 is a logic high during this periphery test mode to avoid any contention with the output of pass gate 72 on Node 1 as shown.

Slave latch circuit 70 enters the periphery stress mode by disabling Memory Stress Mode signal 94, which is accomplished by forcing Memory Stress Mode signal 94 to a low logic level for the duration of the periphery stress mode, and by allowing Power-On Reset signal 86 to pulse low upon power-up of the synchronous RAM device such that latches and flip-flops and therefore all rows and columns of the memory array are disabled. As noted above, pulsing Power-On Reset signal 86 upon power-up in the periphery stress mode allows maximum fault coverage of possible latent defects within decoder and periphery circuits such as slave latch circuit 70. Additionally, initializing slave latch circuit 70 in a deselecting state disables all the D.C. current paths of circuit 70 such that a high Vcc stress voltage, such as 9 volts, may be applied in the periphery stress mode without fear of "snap back voltage".

Another aspect of the present invention is that all D.C. (direct current) paths of the synchronous RAM are disabled so that a high power supply voltage may be applied during the periphery stress mode without fear of transistor "snap back voltage". This includes bias voltage circuits to control slew rate on output signals and to control the output high voltage maximum level. Thus, once all D.C. paths of the synchronous RAM are disabled, a Vcc voltage level as high as ten volts may be applied during the periphery stress mode without experiencing transistor impact ionization due to high substrate current, known as BVDII or "snap back voltage".

According to the present invention, a method for performing stress testing of decoders and other periphery circuits of synchronous RAMs within a reasonable period of time and without an increase in the complexity of stress testing or fabrication of synchronous RAMs is disclosed. In order to stress test decoders and periphery circuits of a synchronous RAM to obtain maximum fault coverage of possible latent defects, a periphery stress mode is defined through appropriate manipulation of the Power-On Reset signal of the device such that all nodes of a memory array of the synchronous RAM are pulled in the opposite logic state from that required for a memory cell stress mode. In the periphery stress mode, the Power-On Reset signal is allowed to pulse upon power-up of the synchronous RAM device such that latches and flip flops of the device are forced to a logic state that disables all rows and columns of the memory array of the device.

Figure 5:
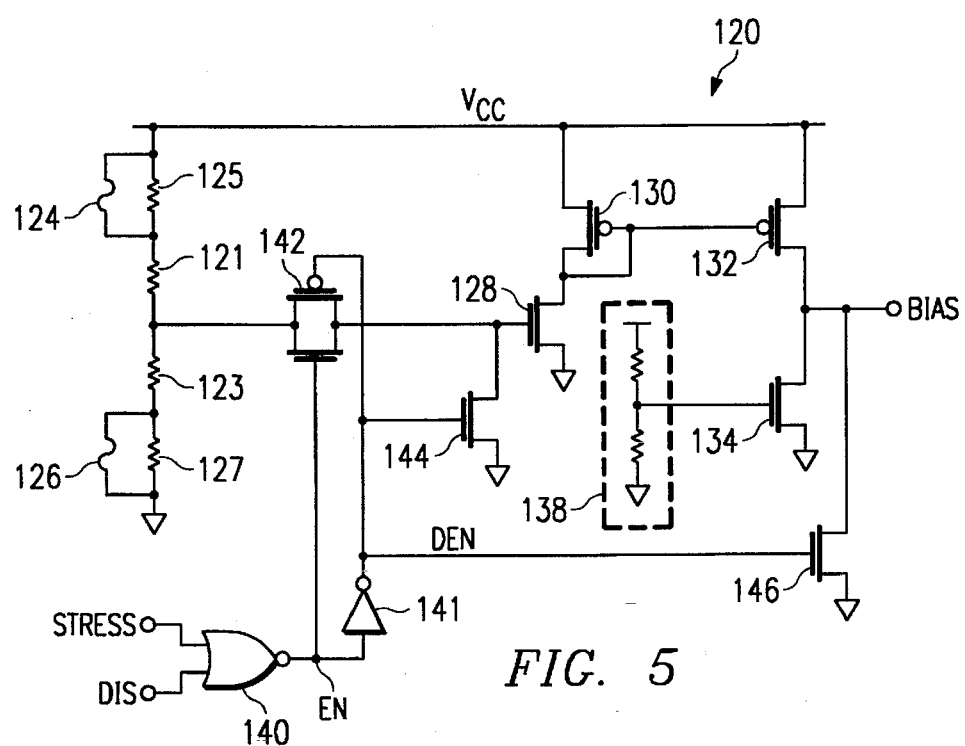
FIG. 5 is a circuit diagram of a slew rate control circuit, according to the present invention.
Figure 6:
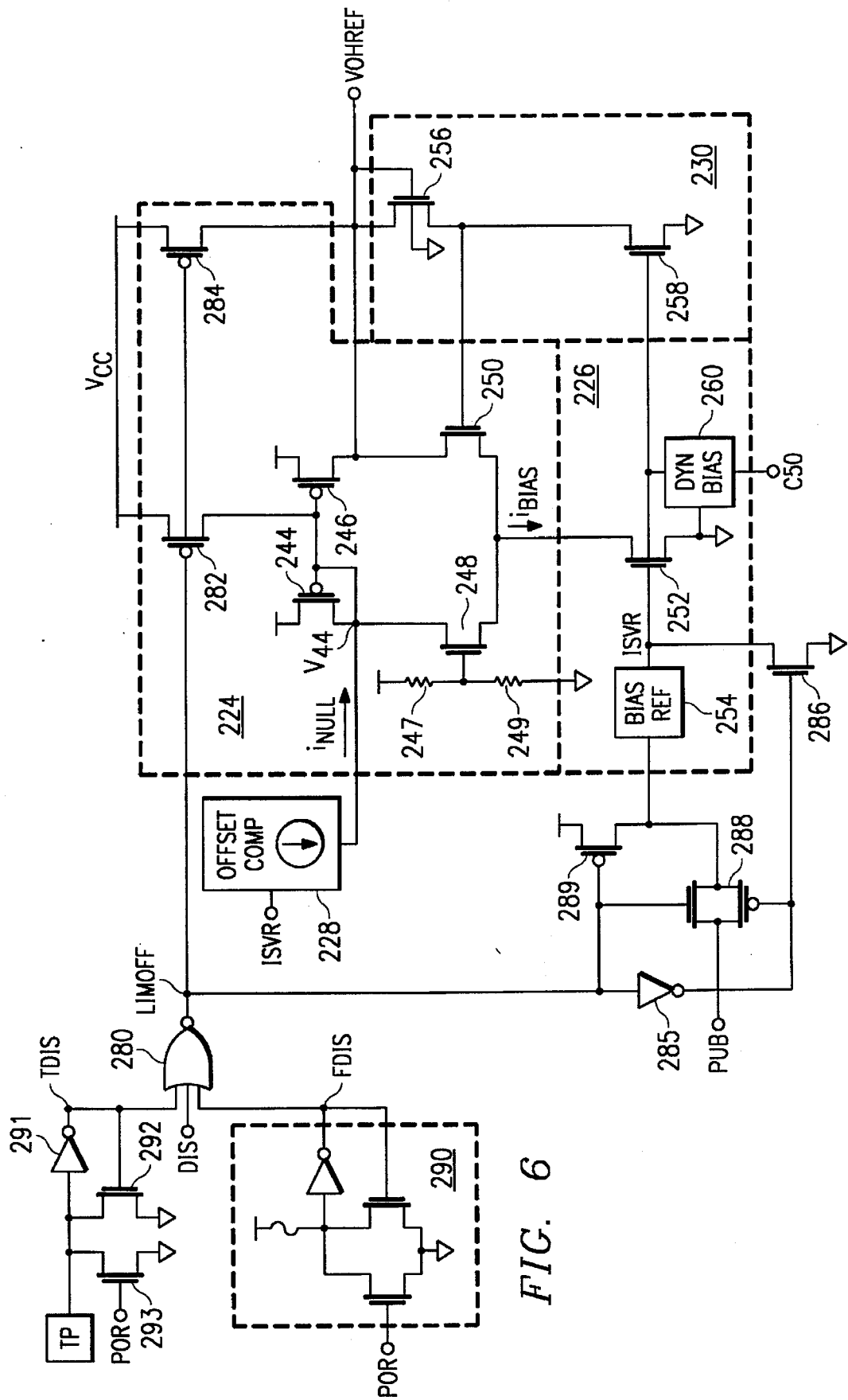
FIG. 6 is a circuit diagram of an output voltage bias circuit, according to the present invention.

Additionally, all D.C. (direct current) paths of the synchronous RAM are disabled so that a high power supply voltage may be applied during the periphery stress mode without fear of transistor "snap back voltage". This includes bias voltage circuits to control slew rate on output signals and to control the output high voltage maximum level. FIGS. 5 and 6 illustrate this aspect of the present invention for a slew rate control circuit and an output voltage bias circuit, respectively, of a synchronous RAM.

Referring to FIG. 5, a circuit diagram of a slew rate control circuit, according to the present invention, is shown. Slew rate control circuit 120 includes a voltage divider of resistors 121 and 123 connected in series between the Vcc power supply and ground potential. The output of the voltage divider, at the node between resistors 121 and 123, is presented to the gate of n-channel transistor 128 after being passed through pass gate 142 which is controlled by the output signal EN of NOR gate 40. As shown in FIG. 5, additional resistors 125 and 127 may also be present in each leg of the voltage divider, with fuses 124 and 126 connected in parallel with resistors 125 and 127, respectively. In this way, the synchronous RAM in which slew rate control circuit 120 is implemented may be fuse programmable to allow adjustment of the voltage applied to the gate of transistor 128, if desired.

The gate of transistor 128 receives the output of the voltage divider of resistors 121 and 123. The source of transistor 128 is biased to ground, and the drain of transistor 128 is connected to the drain and gate of p-channel transistor 130, which in turn has its source tied to Vcc. The combination of transistors 128 and 120 define a reference leg of a current mirror, with the current conducted through the current mirror substantially controlled by the voltage output of the voltage divider comprised of resistors 121 and 123. Thus, the voltage applied to the gate of transistor 128 and thus the current conducted by transistors 128 and 130 in the reference leg of the current mirror, will vary with variations in the voltage of the Vcc power supply, but will maintain the same ratio relative to a varying Vcc power supply.

The output leg of the current mirror in bias circuit 120 includes p-channel mirror transistor 132 and linear load device 134. P-channel transistor 132 has its source connected to Vcc and its gate connected to the gate and drain of transistor 130, in current mirror fashion. The drain of transistor 132 is connected to the linear load device 134, at line BIAS. The gate of linear load transistor 134 is set by voltage divider 138, such that the gate voltage of transistor 134 is a specified fraction of the Vcc power supply voltage. Transistor 134, while operating substantially as a linear load, is in fact a voltage-controlled resistor, such that its resistance is a function of the gate-to-source voltage. By applying only a fraction of Vcc to the gate of transistor 134, undesired reduction of the resistance of transistor 134 may be reduced in the event that Vcc makes a positive transition.

Line EN, the output of NOR gate 140, is responsive to disabling conditions on either line DIS or line STRESS. Line EN is connected directly to the n-channel side of pass gate 142 and is connected via inverter 141 to the p-channel side of pass gate 142, so that pass gate 142 is conductive when line EN is a logic high and is open when line EN is logic low. Line DEN is also connected to the gates of n-channel transistors 144 and 146. Transistor 144 has its drain connected to the gate of transistor 128, and transistor 146 has its drain connected to line BIAS; the sources of transistors 144 and 146 are connected to ground potential, as shown.

According to the present invention slew rate control circuit 120 may be disabled during a periphery stress mode such that all D.C. current paths are disabled and no transistor current is consumed. Pass gate 142 may be turned off by appropriate manipulation of STRESS signal or DIS disable signal, both of which are input signals to NOR gate 140. When either of lines DIS and STRESS are a high logic level, pass gate 142 is turned off. Transistor 144 is turned on by line DEN being high, which turns off transistor 128 by pulling its gate to ground; this inhibits current from being conducted through either of transistors 130 or 132. Transistor 146 is also turned on by line DEN being high, pulling line BIAS to ground. Line DIS is generated elsewhere and presents a high logic level when slew rate control circuit 120 is to be disabled. Line STRESS presents a high logic level during a stress mode, such as a memory cell stress mode. Thus, during a periphery stress mode, slew rate control circuit 120 may be disabled when line DIS is a high logic level, such that all D.C. current paths are disabled and thus no transistor current is consumed.

Referring to FIG. 6, a circuit diagram of an output voltage bias circuit, according to the present invention, is shown. Voltage reference and regulator 224 is constructed in current mirror fashion. P-channel transistors 244 and 246 each have their sources biased to power supply Vcc as shown, with their gates connected together. In the reference leg of this current mirror, the drain of transistor 244 is connected to its gate, and to the drain of n-channel transistor 248. The gate of n-channel transistor 248 is connected to a voltage divider constructed of resistors 247 and 249 which are connected in series between power supply Vcc and ground potential, where the gate of transistor 248 is connected at a point between resistors 247 and 249 to receive the desired fraction, such as 60%, of Vcc power supply.

The source of transistor 248 is connected to bias current source 226. In the mirror leg of this current mirror, the drain of transistor 246 is connected, at output node VOHREF, to the drain of n-channel transistor 250. The gate of transistor 250 is coupled to node VOHREF via Vt shift circuit 230. The source of n-channel transistor 250 is connected to the source of transistor 248 in the reference leg and thus to bias current source 226. Bias current source 226 conducts a current Ibias which is the sum of the currents in the reference and mirror legs in the current mirror of voltage reference and regulator 224. Vt shift circuit 230 provides the bias of the gate of n-channel transistor 250 in the mirror leg of voltage reference and regulator 224, to ensure that voltage VOHREF is shifted upward by an n-channel threshold voltage, considering that voltage VOHREF will be applied to the gate of n-channel pull-up transistors 232 in output drivers 221.

Bias reference circuit 254 of voltage reference and regulator 224 presents a bias voltage to the gate of n-channel transistor 252 to set the value of Ibias conducted through the current mirror; dynamic bias circuit 260 is effectively off at this time. The divided voltage generated by resistors 247 and 249, which is presented as a reference voltage to the gate of n-channel transistor 248, determines the extent to which transistor 248 is conductive and thus determines the bias condition at the drain of p-channel transistor 244. The current conducted by transistor 244 is mirrored by transistor 246 in the mirror leg, and will be a multiple of the current conducted by transistor 244.

In addition to the previously described elements, voltage reference and regulator 224 includes p-channel transistors 282, 284, 289, and n-channel transistor 286, which force certain nodes to Vcc or to ground in the event that the VOHREF limiting function is to be disabled, as determined by the output of NOR gate 280. Each of p-channel transistors 282, 284, and 289 has its source biased to Vcc and its gate receiving line LIMOFF from the output of NOR gate 280. The drain of transistor 282 is connected to the gates of transistors 244 and 246 in the current mirror of voltage reference and regulator 224, the drain of transistor 284 is connected to the input to bias reference circuit 254. N-channel transistor 286 has its drain connected to node ISVR in bias current source 226, has its source connected to ground, and its gate receives signal LIMOFF, after inversion by inverter 285. Pass gate 288 is provided between voltage PVBIAS and bias reference circuit 254, and is controlled by true and complement signals based on the signal LIMOFF. If line LIMOFF at the output of NOR gate 280 is a high logic level, transistors 282, 284, 286, 289 are all turned off and pass gate 288 is turned on.

However, if line LIMOFF at the output of NOR gate 280 is a low logic level, transistors 282, 284, 286, and 289 are all turned off and pass gate 288 Is turned off. In this condition, line VOHREF is forced to Vcc. The gates of transistors 244 and 246 are pulled to Vcc by transistor 282, thus turning off both of the reference and mirror legs in voltage reference and regulator 224. Pass gate 288 disconnects voltage PVBIAS from bias reference circuit 254, transistor 289 pulls the input to bias reference circuit 254 to Vcc, and transistor 286 pulls node ISVR to ground, thus turning off transistors 252 and 258.

According to the present invention, output voltage bias circuit 200 may be disabled furing a periphery stress mode such that all D.C. current paths are disabled and thus no transistor current is consumed. NOR gate 280 receives three input signals, logical signal DIS which may be generated elsewhere in a memory, the signal FDIS which is generated by fuse circuit 290 any one of which being at a high level will cuase line LIMOFF to be driven low. Fuse circuit 290 is constructed such that node FDIS is a low logic level with the fuse intact and a high logic level if the fuse is blown.

A special test pad TP can also control the enabling and disabling of voltage reference and regulator 224 during electrical test in wafer form, prior to packaging. Test pad TP is connected to the input of inverter 291 which drive node TDIS received as an input of NOR gate 280. Transistor 292 has its source/drain path connected between the input of inverter 291 and ground, and has its gate connected to TDIS at the output of inverter 291. Transistor 293 has its source/drain path connected between the input of inverter 291 and ground potential, and its gate controlled by the power on reset signal POR. If test pad TP is Vcc, inverter 291 will force node TDIS to a low logic level. However, if test pad TP is left open or is connected to ground, upon power up transistor 293 will pull the input of inverter 291 to a low logic level, forcing a high logic level on node TDIS which is maintained through operation of transistor 292. It is contemplated that test pad TP thus control the enabling and disabling of voltage reference and regulator 224 during electrical test. Test pad TP may be wire-bonded to Vcc if voltage reference and regulator 224 is to be permanently enabled, or left open if voltage reference and regulator 224 is to be permanently disabled.

Entry and exit into the periphery stress test mode of a synchronous RAM may be accomplished through a wafer level test pin where the test pin is not bonded or is down-bonded as is appropriate. Entry and exit into the periphery stress mode of a synchronous RAM may also be accomplished by applying a super voltage to a package pin of a synchronous RAM.

Entry into a periphery stress mode simply through the manipulation of a Power-On Reset signal of the synchronous RAM addresses the concerns of the prior art with stress testing of decoders and other periphery circuits. By appropriately setting the Power-On Reset signal such that latches and flip flops of the device are forced to a logic state that disables all rows and columns of the memory array of the device, it is not necessary to individually select and stress each address combination of a large synchronous RAM and thus periphery stress testing may be performed within a reasonable period of time. Additionally, use of the Power-On Reset signal which is common to synchronous RAMs provides for the testing of decoders and other periphery circuits without increasing the complexity of stress testing or fabrication of existing synchronous RAMs.

While the invention has been particularly shown and described with reference to a preferred embodiment, it will be understood by those skilled in the art that various changes in form and detail may be made therein without departing from the spirit and scope of the invention.

What is claimed is:

1. A method for stress testing decoders and periphery circuits of a synchronous RAM (Random Access Memory) comprising the steps of:

entering a periphery stress mode by forcing a control signal of a synchronous RAM to a first logic level; and applying a stress voltage to the synchronous RAM in order to stress test a plurality of decoders of the synchronous RAM, wherein entry into and exit from the periphery stress mode is accomplished through a wafer level test pin of the synchronous RAM.

2. A method for stress testing decoders and periphery circuits of a synchronous RAM (Random Access Memory) comprising the steps of:

entering a periphery stress mode by forcing a control signal of a synchronous RAM to a first logic level; and applying a stress voltage to the synchronous RAM in order to stress test a plurality of decoders of the synchronous RAM, wherein entry into and exit from the periphery stress mode is accomplished by applying a super voltage to a package pin of the synchronous RAM.

3. A method for stress testing decoders and periphery circuits of a synchronous RAM (Random Access Memory) comprising the steps of:

entering a periphery stress mode by forcing a control signal of a synchronous RAM to a first logic level; and applying a stress voltage to the synchronous RAM in order to stress test a plurality of decoders of the synchronous RAM, wherein the control signal allows pulsing of a power-on reset signal while in the periphery stress mode.

4. The method of claim 3, wherein each decoder of the plurality of decoders contains a latch.

5. The method of claim 4, wherein the latch which couples to the decoder, is forced to a second logic level which results in a plurality of elements controlled by the decoder being deselected.

6. The method of claim 5, wherein the decoder is a row decoder and the plurality of elements are a plurality of rows.

7. The method of claim 5, wherein the decoder is a column decoder and the plurality of elements are a plurality of columns.

8. The method of claim 5, wherein the latch is forced to the second logic level while in the periphery stress mode.

9. The method of claim 5, wherein the latch is forced to the second logic level upon a power-up condition of the synchronous RAM.

10. The method of claim 3, wherein upon power-up of the Synchronous RAM, the power-on reset signal is allowed to pulse such that the plurality of decoders are each in a deselecting state.

11. The method of claim 10, wherein a plurality of rows and a plurality of columns of the synchronous RAM are deselected when, upon power-up of the synchronous RAM, the power-on reset signal is allowed to pulse.

12. A method for stress testing decoders and periphery circuits of a synchronous RAM (Random Access Memory) comprising the steps of:

entering a periphery stress mode by forcing a control signal of a synchronous RAM to a first logic level; and applying a stress voltage to the synchronous RAM in order to stress test a plurality of decoders of the synchronous RAM wherein forcing the control signal of the synchronous RAM to the first logic level causes each decoder of the plurality of decoders to be in a deselecting state.

13. A method for stress testing decoders and periphery circuits of a synchronous RAM (Random Access Memory), comprising the steps of:

disabling a plurality of direct current paths of a synchronous RAM;

entering a periphery stress mode by forcing a control signal of a synchronous RAM to a first logic level; and applying a stress voltage to the synchronous RAM in order to stress test a plurality of decoders of the synchronous RAM.

14. A method for stress testing decoders and periphery circuits of a synchronous RAM (Random Access Memory), comprising the steps of:

disabling a plurality of direct current paths of a synchronous RAM;

entering a periphery stress mode by forcing a control signal of the synchronous RAM to a first logic level, wherein entry into and exit from the periphery stress mode is accomplished through a wafer level test pin of the synchronous RAM; and applying a stress voltage to the synchronous RAM in order to stress test a plurality of decoders of the synchronous RAM.

15. The method of claim 13, wherein entry into and exit from the periphery stress mode is accomplished by applying a super voltage to a package pin of the synchronous RAM.

16. The method of claim 13, wherein disabling the plurality of direct current paths of the synchronous RAM disables a slew rate control circuit of the synchronous RAM.

17. The method of claim 13, wherein disabling the plurality of direct current paths of the synchronous RAM disables an output voltage bias circuit of the synchronous RAM.

18. A method for stress testing decoders and periphery circuits of a synchronous RAM (Random Access Memory), comprising the steps of:

disabling a plurality of direct current paths of a synchronous RAM;

entering a periphery stress mode by forcing a control signal of the synchronous RAM to a first logic level; and applying a stress voltage to the synchronous RAM in order to stress test a plurality of decoders of the synchronous RAM wherein the control signal allows pulsing of a power-on reset signal while in the periphery stress mode.

19. The method of claim 18, wherein each decoder of the plurality of decoders contains a latch.

20. The method of claim 19, wherein the latch, which couples to the decoder, is forced to a second logic level which results in a plurality of elements controlled by the decoder being deselected.

21. The method of claim 20, wherein the decoder is a row decoder and the plurality of elements are a plurality of rows.

22. The method of claim 20, wherein the decoder is column decoder and the plurality of elements are a plurality of columns.

23. The method of claim 20, wherein the latch is forced to the second logic level while in the periphery stress mode.

24. The method of claim 20, wherein the latch is forced to the second logic level upon a power-up condition of the synchronous RAM.

25. The method of claim 18, wherein upon power-up of the synchronous RAM, the power-on reset signal is allowed to pulse such that the plurality of decoders are each in a deselecting state.

26. The method of claim 25, wherein a plurality of rows and a plurality of columns of the synchronous RAM are deselected when, upon power-up of the synchronous RAM, the power-on reset signal is allowed to pulse.

27. The method of claim 13, wherein forcing the control signal of the synchronous RAM to the first logic level causes each decoder of the plurality of decoders to be in a deselecting state.

28. A method for stress testing decoders and periphery circuits of a synchronous RAM (Random Access Memory), comprising the steps of:

disabling a plurality of direct current paths of a synchronous RAM, wherein disabling the plurality of direct current paths disables the direct current paths of the synchronous RAM such that a plurality of transistors of the synchronous RAM are not operating in saturation;

entering a periphery stress mode by forcing a control signal of the synchronous RAM to a first logic level; and applying a stress voltage to the synchronous RAM in order to stress test a plurality of decoders of the synchronous RAM.

29. A method for stress testing decoders and periphery circuits of a synchronous RAM (Random Access Memory), comprising the steps of:

disabling a plurality of direct current paths of a synchronous RAM, wherein disabling the plurality of direct current paths allows a large value of the stress voltage to be applied to the synchronous RAM without causing a "snap back voltage" phenomenon;

entering a periphery stress mode by forcing a control signal of the synchronous RAM to a first logic level; and applying a stress voltage to the synchronous RAM in order to stress test a plurality of decoders of the synchronous RAM.

30. The method of claim 29, wherein the stress voltage applied to the synchronous RAM is between approximately 7 volts and 10 volts.

31. The method of claim 13, wherein the plurality of decoders are a plurality of global word line decoders.

32. The method of claim 13, wherein the plurality of decoders are a plurality of column decoders.

33. The method of claim 13, wherein the plurality of decoders are a plurality of row decoders.

34. The method of claim 13, wherein the plurality of decoders are a plurality of write decoders.

35. The method of claim 13, wherein the plurality of decoders are a plurality of pre-decoding circuits.

36. The method of claim 13, wherein the plurality of decoders are a plurality of post-decoding circuits.

37. The method of claim 13, wherein the synchronous RAM is a Burst RAM.

38. The method of claim 13, wherein the step of entering the periphery stress mode is performed after the step of applying the stress voltage to the synchronous RAM in order to stress test a plurality of decoders of the synchronous RAM.

* * * * *